(12) United States Patent
Peng et al.

(10) Patent No.: US 11,618,853 B2
(45) Date of Patent: Apr. 4, 2023

(54) QLED AND METHOD FOR MANUFACTURING QUANTUM DOT

(71) Applicants: Zhejiang University, Zhejiang (CN); Najing Technology Corporation Limited, Zhejiang (CN)

(72) Inventors: Xiaogang Peng, Zhejiang (CN); Chaodan Pu, Zhejiang (CN); Yizheng Jin, Zhejiang (CN)

(73) Assignees: Zhejiang University, Zhejiang (CN); Najing Technology Corporation Limited, Zhejiang (CN)

( * ) Notice: Subject to any disclaimer, the term of this patent is extended or adjusted under 35 U.S.C. 154(b) by 44 days.

(21) Appl. No.: 17/285,947

(22) PCT Filed: Sep. 5, 2019

(86) PCT No.: PCT/CN2019/104533
§ 371 (c)(1),
(2) Date: Apr. 16, 2021

(87) PCT Pub. No.: WO2020/078143
PCT Pub. Date: Apr. 23, 2020

(65) Prior Publication Data
US 2021/0380878 A1     Dec. 9, 2021

(30) Foreign Application Priority Data

Oct. 18, 2018   (CN) .......................... 201811216931.X

(51) Int. Cl.
| | | |
|---|---|---|
| C09K 11/02 | (2006.01) | |
| C09K 11/88 | (2006.01) | |
| H10K 50/115 | (2023.01) | |
| H05B 33/14 | (2006.01) | |
| B82Y 20/00 | (2011.01) | |
| B82Y 40/00 | (2011.01) | |
| H01L 51/50 | (2006.01) | |

(52) U.S. Cl.
CPC .......... *C09K 11/025* (2013.01); *C09K 11/883* (2013.01); *H01L 51/502* (2013.01); *H05B 33/14* (2013.01); *B82Y 20/00* (2013.01); *B82Y 40/00* (2013.01)

(58) Field of Classification Search
CPC ... C09K 11/025; C09K 11/883; H01L 51/502; H05B 33/14
See application file for complete search history.

(56) References Cited

U.S. PATENT DOCUMENTS

| | | | | |
|---|---|---|---|---|
| 9,324,562 | B1* | 4/2016 | Luther | .............. H01L 21/465 |
| 2009/0110642 | A1* | 4/2009 | Woo | .............. A61K 49/186 |
| | | | | 424/9.1 |
| 2010/0159249 | A1* | 6/2010 | Jang | .............. H05B 33/14 |
| | | | | 438/584 |
| 2011/0175054 | A1* | 7/2011 | Ren | .............. C09K 11/025 |
| | | | | 977/773 |
| 2019/0081263 | A1* | 3/2019 | Park | .............. H01L 21/02601 |

FOREIGN PATENT DOCUMENTS

| | | | |
|---|---|---|---|
| CN | 101422621 | A | 5/2009 |
| CN | 103059868 | A | 4/2013 |
| CN | 104387772 | A | 3/2015 |
| CN | 105940081 | A | 9/2016 |
| CN | 105985774 | * | 10/2016 |
| CN | 105985774 | A | 10/2016 |
| CN | 107629783 | * | 1/2018 |
| CN | 107629783 | A | 1/2018 |
| CN | 108110144 | A | 6/2018 |
| CN | 109468134 | * | 3/2019 |
| CN | 109468134 | A | 3/2019 |
| WO | 2006065054 | A | 6/2006 |
| WO | WO 2013/114308 | * | 8/2013 |
| WO | 2017147382 | A1 | 8/2017 |

OTHER PUBLICATIONS

Bakueva et al., "Size-tunable infraed (1000-1600 nm) electroluminescence from PbS quantum-dot nanocrystals in a semi-conducting polymer", Applied Physics Letters, vol. 82, No. 17, Apr. 28, 2003, pp. 2895-2897.*

Nicholas C. Anderson;<Ligand exchange and the stoichiometry of metal chalcogenide nanocrystals: spectroscopic observation of facile metal-carboxylate displacement and binding>; «Journal of the American Chemical Society» ;Nov. 7, 2013; vol. 135, No. 49.

Yi Shen;<Quantum yield regeneration: Influence of neutral ligand binding on photophysical properties in colloidal core/shell quantum dots>; «ACS Nano» ;Mar. 9, 2015; vol. 9, No. 3.

Martyna Michalska; <Amine ligands control of the optical properties and the shape of thermally grown core/shell CuInS2/ZnS quantum dots>; (Journal of Alloys and Compounds» ;May 9, 2015;vol. 645.

Zhou Jianhai;<IIdeal CdSe/CdS core/shell nanocrystals enabled by entropic ligands and their core size-, shell thickness-, and ligand-dependent photoluminescence properties>; (Journal of the American Chemical Society» ;Nov. 2, 2017; vol. 139; No. 46.

(Continued)

*Primary Examiner* — C Melissa Koslow
(74) *Attorney, Agent, or Firm* — Gang Yu

(57) ABSTRACT

Provided are a QLED and a method for manufacturing a quantum dot. The QLED comprises a quantum dot, the quantum dot comprises a quantum dot body and ligands arranged on an outer surface of the quantum dot body, wherein the ligands comprises at least one electrochemical inert ligand; a reduction potential of the at least one electrochemical inert ligand is greater than a potential of a bottom of conduction band of the quantum dot body; an oxidation potential of the at least one electrochemical inert ligand is less than a potential of top of a valence band the quantum dot body; and the electrochemical inert ligand accounts for at least 80% of all the ligands on the outer surface of the quantum dot body.

13 Claims, 4 Drawing Sheets

(56) References Cited

OTHER PUBLICATIONS

David Morgan;<Spectroscopy of surface-state p-doped CdSe/CdS quantum dots>; «The Journal of Physical Chemistry Letters»;Jul. 10, 2018;vol. 9 ,No. 15.

Zhou Jianhai et al., < Ideal CdSe/CdS core/shell nanocrystals enabled by entropic ligands and their core size, shell thickness, and ligand-dependent photoluminescence properties> , from «Journal of the American Chemical Society», vol. 139 , No. 46, Nov. 2, 2017. pp. 16556-16567.

G, Krishnamurthy Grandhi et al., <Understanding the Role of Surface Capping Ligands in Passivating the Quantum Dots Using Copper Dopants as Internal Sensor>, from «J.Phys. Chem. C» vol. 120, Aug. 8, 2016. p. 19785-19795.

\* cited by examiner

QLED AND METHOD FOR MANUFACTURING QUANTUM DOT

CROSS-REFERENCE TO RELATED APPLICATIONS

The present disclosure claims priority to Chinese Patent Application No. 201811216931.X, submitted to the China National Intellectual Property Administration (CNIPA) on Oct. 18, 2018, and entitled "Quantum Dot, Manufacturing Method, Single Photon Source and QLED", the contents of which are hereby incorporated by reference in its entirety.

TECHNICAL FIELD

The present disclosure relates to the field of optoelectronics, and in particular, to a QLED and a method for manufacturing a quantum dot.

BACKGROUND

Quantum dot light-emitting diode (QLED) is an electroluminescent device that uses quantum dots as its light-emitting center. Quantum dots are inorganic semiconductor nanocrystals dispersed in a solution, so they can be processed through a solution process. It is generally believed that inorganic semiconductor nanocrystals have high photochemical stability. Therefore, QLED has the advantages of efficient and stable inorganic light-emitting centers and solution processing, and is expected to achieve high-performance solution-processed LED. In addition, quantum dots have continuously adjustable emission wavelength, narrow full width at half maximum of the emission spectrum, and high color purity, thus having unique advantage in the modulation of wide color gamut display and white light source with high color rendering index. In the past two decades, the research on the efficiency and lifetime of QLED devices has attracted extensive attention from researchers worldwide.

With the progress of quantum dot synthesis chemistry, researchers can now synthesize quantum dots in large quantities with photoluminescence efficiency close to 100%. Combined with the design of the device structure and the optimization of the device manufacturing process, at present, the external quantum efficiency (EQE) of QLED including red, green and blue has exceeded 20%. Although the EQE of QLED devices has improved dramatically in the past five years, the stability of the devices is not satisfactory, especially for blue devices. So far, the stability of all reported blue devices has decreased from an initial brightness of 1000 $cd^{-2}$ to 500 $cd^{-2}$ in less than 35 h, that is, the half lifetime of the blue device $T_{50}$<35 h.

QLED usually uses quantum dots with a core-shell structure. On the one hand, the light-emitting center is considered to be an inorganic crystal with excellent stability; on the other hand, the shell layer protects the light-emitting center while playing the role of isolating different light-emitting centers, suppressing the quenching of luminescence caused by exciton-exciton interaction. These advantages theoretically assure excellent stability of QLED. In fact, the stability of current QLED is poor, and the stability advantages of quantum dots as inorganic crystals have not been fully utilized. Therefore, how to improve the stability of QLED is a vital issue. At present, many researchers have improved the stability of QLED from the perspective of carrier injection balance.

The above information disclosed in the background section is only used to strengthen the understanding of the background technology of the technology described in this disclosure, therefore, the background technology may contain certain information, which is not known prior art for those skilled in the art.

SUMMARY

According to one aspect of the present disclosure, a is provided, the quantum dot includes a quantum dot body and ligands disposed on an outer surface of the quantum dot body, the ligands include at least one electrochemical inert ligand, a reduction potential of the at least one electrochemical inert ligand is greater than a potential of a bottom of a conduction band of the quantum dot body, an oxidation potential of the at least one electrochemical inert ligand is less than a potential of a top of a valence band of the quantum dot body, the at least one electrochemical Inert ligand accounts for at least 80% of all ligands on the outer surface of the quantum dot body.

In some embodiments, the at least one electrochemical inert ligand includes at least one amine ligand, at least one alkylphosphine ligand, at least one metal carboxylate ligand, at least one metal phosphonate ligand, at least one inorganic metal salt ligand, at least one thiolate ligand, or a combination thereof; the at least one metal carboxylate ligand includes at least one magnesium carboxylate ligand, at least one calcium carboxylate ligand, at least one aluminum carboxylate ligand, at least one zirconium carboxylate ligand, at least one lithium carboxylate ligand, at least one carboxylate sodium ligand, at least one barium carboxylate ligand, or a combination thereof, at least one anion of the inorganic metal salt ligand includes at least one halogen ion, at least one phosphate ion, at least one sulfate ion, or a combination thereof, at least one cation of the inorganic metal salt ligand includes at least one cation on a surface of the quantum dot body; preferably, the number of carbon in the metal carboxylate ligand and the metal phosphonate ligand is less than or equal to 22.

In some embodiments, the at least one electrochemical inert ligand is a fatty amine ligand, preferably the number of carbon in the fatty amine ligand is between 4 and 22, and more preferably the fatty amine ligand is a C8-C18 primary amine ligand.

In some embodiments, the at least one electrochemical inert ligand accounts for at least 90% of all the ligands on the outer surface of the quantum dot body, preferably 100%.

In some embodiments, the quantum dot body includes a quantum dot core and a shell coating the quantum dot core.

According to another aspect of the present disclosure, a method for manufacturing a quantum dot is provided. The manufacturing method includes: step S1, preparing a preliminary body of a quantum dot, the preliminary body including a quantum dot body and preliminary ligands on an outer surface of the quantum dot body; step S2, replacing at least part of the preliminary ligands with at least one modifier to form at least one electrochemical inert ligand on the outer surface of the quantum dot body, thereby forming the quantum dot, a reduction potential of the at least one electrochemical inert ligand is greater than a potential of a bottom of a conduction band of the quantum dot body, an oxidation potential of the at least one electrochemical inert ligand is less than a potential of a top of a valence band of the quantum dot body, and a replacement ratio of preliminary ligands with the at least one electrochemical inert ligands is at least 80%, and the at least one modifier includes the at least one electrochemical inert ligand, a compound including at least one cation of the at least one electrochemical inert ligand, a compound including at least one anion of the at least one electrochemical inert ligand, or their combinations.

In some embodiments, the at least one modifier includes a first modifier, and the step S2 includes: step S21, preparing a first mixed solution, and heating the first mixed solution so that the first modifier replaces at least part of each one of the preliminary ligands to form a first electrochemical inert ligand on the outer surface of the quantum dot body, and purifying the first mixed solution after replacement to obtain the quantum dot, the first mixed solution including the preliminary body, a first solvent, and the first modifier.

In some embodiments, the at least one modifier further includes a second modifier, after the step S21, the manufacturing method further includes step S22, the above step S22 includes: preparing a second mixed solution, replacing at least part of the preliminary ligands with the second modifier to form a second electrochemical inert ligand on the outer surface of the quantum dot body, the second mixed solution including the quantum dot, a second solvent and the second modifier; heating the second mixed solution until a quantum yield of the quantum dot is greater than or equal to 80%.

In some embodiments, the at least one modifier includes at least one fatty amine, at least one alkylphosphine, at least one metal carboxylate, at least one inorganic metal salt, at least one inorganic acid and at least one thiolate, or a combination thereof.

In some embodiments, at least one cation of the at least one inorganic metal salt includes at least one calcium ion, at least one magnesium ion, at least one aluminum ion, at least one zirconium ion, at least one lithium ion, at least one sodium ion, at least one barium ion, or a combination thereof.

In some embodiments, at least one cation of the at least one metal carboxylate includes at least one calcium ion, at least one magnesium ion, at least one aluminum ion, at least one zirconium ion, at least one lithium ion, at least one sodium ion, at least one barium ion, or a combination thereof.

In some embodiments, at least one cation of the at least one inorganic metal salt and at least one cation of the at least one metal carboxylate include at least one calcium ion, at least one magnesium ion, at least one aluminum ion, at least one zirconium ion, at least one lithium ion, at least one sodium ion, at least one barium ion, or a combination thereof.

In some embodiments, at least one anion of the at least one inorganic metal salt includes at least one halogen ion, at least one phosphate ion, at least one sulfate ion, or a combination thereof.

In some embodiments, at least one anion of the at least one inorganic acid includes at least one halogen ion, at least one phosphate ion, at least one sulfate ion, or a combination thereof.

In some embodiments, at least one anion of the at least one inorganic metal salt and at least one anion of the inorganic acid include at least one halogen ion, at least one phosphate ion, at least one sulfate ion, or a combination thereof.

In some embodiments, the first mixed solution further includes a precursor of an anion which is same with an anion of the quantum dot body.

In some embodiments, the above-mentioned electrochemical inert ligand includes a fatty amine.

In some embodiments, the above-mentioned electrochemical inert ligand includes an alkylphosphine.

In some embodiments, the above-mentioned electrochemical inert ligand includes a fatty amine and an alkylphosphine.

In some embodiments, the fatty amine is C4-C22 fatty amine.

In some embodiments, the fatty amine is a C8-C18 primary amine.

According to yet another aspect of the present disclosure, there is provided a single photon source, including at least one quantum dot, the at least one quantum dot is any one of the above-mentioned quantum dot or manufactured by any one of the above-mentioned manufacturing method.

According to still another aspect of the present disclosure, there is provided a QLED device including at least one quantum dot, the at least one quantum dot is any one of the above-mentioned quantum dots or manufactured by any one of the above-mentioned manufacturing method.

BRIEF DESCRIPTION OF THE DRAWINGS

The accompanying drawings forming part of the present disclosure are used to provide a further understanding of the present disclosure. The exemplary embodiments and descriptions of the present disclosure are used to explain the present disclosure and do not constitute an undue limitation on the present disclosure. In the drawings.

DETAILED DESCRIPTION OF THE EMBODIMENTS

Figure 1:
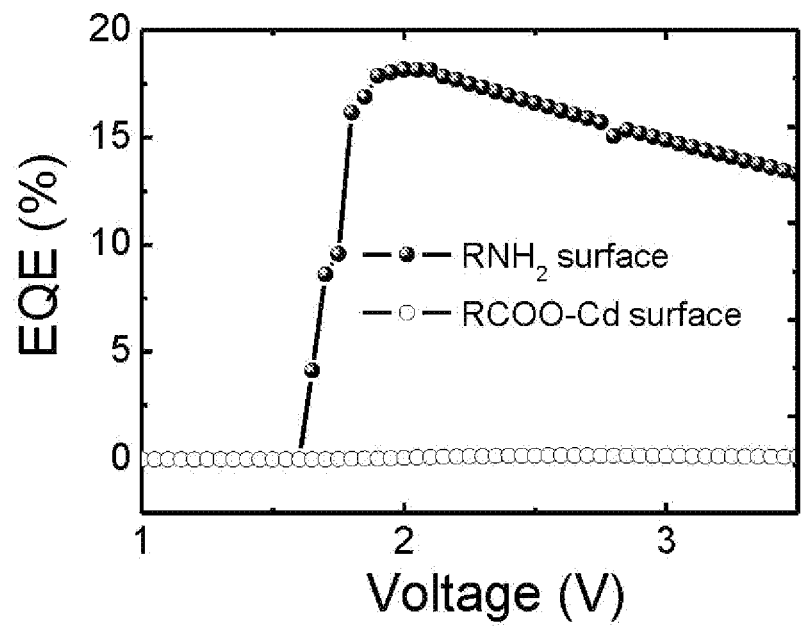
FIGS. 1 to 7 show test results of some examples.

It should be noted that the following detailed descriptions are illustrative and are intended to provide further explanations of the present disclosure. Unless otherwise indicated, all technical and scientific terms used herein have the same meaning as commonly understood by those of ordinary skill in the technical field to which this disclosure belongs.

It should be noted that the terminology used herein is for describing specific embodiments only, and is not intended to limit exemplary embodiments according to the present disclosure. As used herein, unless the context clearly indicates otherwise, the singular form is also intended to include the plural form. In addition, it should also be understood that when the terms "comprising" and/or "including" are used in this specification, they indicate features, steps, operations, devices, components, and/or combinations thereof.

The inventors found that when quantum dot film is placed in a QLED device, under electrical excitation condition, the carriers and ligands will undergo electrochemical reaction. On the one hand, the carriers are consumed so that they are not used for luminescence; on the other hand, the ligands on the surface of the quantum dot are detached to form a defect state, thereby greatly reducing the luminous efficiency of the quantum dot, and ultimately affecting the stability of the device. Therefore, the stability of the quantum dot surface ligands will have an important impact on the stability of QLED device.

The inventors found that in the prior art, the ligands on the surface of quantum dot react with carriers under electrical excitation condition and the ligand detachment causes low luminous efficiency of the device. Sometimes, the reaction between the ligands and the carriers under the excitation condition causes low luminous efficiency of the device, and sometimes the ligand on the surface of the quantum dot falling off under the electrical excitation condition causes low luminous efficiency of the device. In order to solve the above problems, the present disclosure provides a quantum dot, a manufacturing method, a single photon source and a QLED.

In some embodiments of the present disclosure, a quantum dot is provided. The quantum dot includes a quantum dot body and ligands disposed on the outer surface of the quantum dot body, and the ligands include at least one electrochemical inert ligand. A reduction potential of the at least one electrochemical inert ligand is greater than a potential of a bottom of a conduction band of the quantum dot body, an oxidation potential of the at least one electrochemical inert ligand is less than a potential of a top of a valence band of the quantum dot body, and the at least one electrochemical inert ligand accounts for at least 80% of all ligands on the outer surface of the quantum dot body, that is, the ligands on the outer surface of the quantum dot body can be multiple types, but at least one electrochemical inert ligand accounts for at least 80% of all ligands, i.e. greater than or equal to 80%, the higher the proportion of electrochemical inert ligand, the higher and more stable the luminous efficiency of quantum dot. 1391 In some embodiments, the quantum dot body is a group II-VI compound, a group III-V compound, a group IV-VI compound, a group compound, a group I-II-IV-VI compound, or a combination thereof.

In some embodiments, the group II-VI compound is a binary element compound selected from CdSe, CdTe, ZnS, ZnSe, ZnTe, ZnO, HgS, HgSe, HgTe, MgSe, MgS, and mixtures thereof; In some embodiments, the group II-VI compound is a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or mixtures thereof, In some embodiments, the group II-VI compound is a quaternary element compound selected from CdZnSeTe, CdZnSTe, CdHgSeS, CdHgSeTe, CdHgSTe, HgZnSeS, HgZnSeTe, HgZnSTe and mixtures thereof. In some embodiments, the group III-V compound is binary element compound selected from GaN, Gap, GaAs, GaSb, AlN, AlP, AlAs, AlSb, InN, InP, InAs, InSb, or mixtures thereof; In some embodiments, the group III-V compound is ternary element compound selected from GaNP, GaAs, GaNSb, GaPAs, GaPSb, AlNP, AlNAs, AlNSb, AlPAs, AlPSb, InNP, InNAs, InNSb, InPAs, InPSb or mixtures thereof; and quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof. In some embodiments, the group IV-VI compound is selected from binary element compound selected from SnS, SnSe, SnTe, PbS, PbSe, PbTe, or mixtures thereof; In some embodiments, the group IV-VI compound is selected from SnSeS, SnSeTe, SnSTe, PbSeS, PbSeTe, PbSTe, SnPbS, SnPbSe, or mixtures thereof; and In some embodiments, the group IV-VI compound is a quaternary element compound selected from SnPbSSe, SnPbSeTe, SnPbSTe or mixtures thereof. In some embodiments. The group compound includes $CuInSe_2$, $CuInS_2$, CuInGaSe, and CuInGaS, but it is not limited thereto. In some embodiments, the group I-II-IV-VI compound includes CuZnSnSe and CuZnSnS, but it is not limited thereto.

The quantum dot body of the quantum dot has the electrochemical inert ligand on the outer surface. Under electrical excitation condition, on the one hand, the ligand is electrochemically stable and will not react with carriers, i.e., no carriers are consumed, so that most of the carriers are used to emit light; on the other hand, because the electrochemical inert ligand is relatively stable, it will not fall off, and then will not form a large number of defects that affect the luminous efficiency of quantum dot. Therefore, the quantum dot including an electrochemical inert ligand has higher luminous efficiency, the corresponding device will be more stable and of higher reliability.

The at least one electrochemical inert ligand on the outer surface of the quantum dot body of the present disclosure is one type or multiple types, and those skilled in the art may select one or more electrochemical inert ligands according to the actual situation on the outer surface of the quantum dot body.

The electrochemical inert ligand of the present disclosure is any potential that satisfies the above "the reduction potential of the at least one electrochemical inert ligand is greater than the potential of the bottom of conduction band of the quantum dot body, the oxidation potential of the at least one electrochemical inert ligand is less than the potential of the top of the valence band of the quantum dot body", a person skilled in the art can select a suitable electrochemical inert ligand according to the actual situation.

In some embodiments, the at least one electrochemical inert ligand includes at least one amine ligand, at least one metal carboxylate ligand, at least one metal phosphonate ligand, at least one inorganic metal salt ligand, at least one thiolate ligand, or a combination thereof; the at least one metal carboxylate ligand includes at least one magnesium carboxylate ligand, at least one calcium carboxylate ligand, at least one aluminum carboxylate ligand, at least one zirconium carboxylate ligand, at least one lithium carboxylate ligand, at least one sodium carboxylate ligand, at least one barium carboxylate ligand, or a combination thereof, at least one anion of the at least one inorganic metal salt ligand may include at least one halogen ion, at least one phosphate ion, at least one sulfate ion or a combination thereof, and at least one cation of the at least one inorganic metal salt ligand includes at least one cation on the surface of the quantum dot body, the at least one thiolate ligand includes at least one cadmium thiolate, at least one zinc thiolate, or a combination thereof.

In order to improve the dispersibility of quantum dot, in some embodiments of the present disclosure, the number of carbon in the metal carboxylate ligand and the metal phosphonate ligand is less than or equal to 22.

In some embodiments of the present disclosure, the electrochemical inert ligand is a fatty amine ligand. The fatty amine ligand is chemically stable under the electric field.

The number of carbon in the fatty amine ligand is between 4 and 22, and it is more preferable that the fatty amine ligand is a C8-C18 primary amine ligand.

In some other embodiments of the present disclosure, the electrochemical inert ligand accounts for at least 90% of all ligands on the outer surface of the quantum dot body, which can further improve the luminous efficiency and stability of the quantum dot. In order to further improve these two properties of the quantum dot, in a preferred embodiment of the present disclosure, the electrochemical inert ligand accounts for 100% of all ligands on the outer surface of the quantum dot body.

The quantum dot body of the present disclosure can be any available quantum dot in the prior art, may be a core-shell quantum dot body, or may be a non-core-shell quantum dot body. Those skilled in the art can select quantum dots with appropriate structures according to the actual situation.

In order to improve stability, in some embodiments of the present disclosure, the quantum dot body includes a quantum dot core and a shell coating the quantum dot core. In this embodiment, the outer surface of the shell is the outer surface of the quantum dot body, and the electrochemical inert ligand is located on the outer surface of the shell.

In some other embodiments of the present disclosure, a method for manufacturing quantum dot is provided. As shown in FIG. 1, the manufacturing method includes: step S1, preparing a preliminary body of a quantum dot, the preliminary body including a quantum dot body and preliminary ligands on an outer surface of the quantum dot body; step S2, replacing at least part of the preliminary ligands with at least one modifier to form at least one electrochemical inert ligand on the outer surface of the quantum dot body, thereby forming the quantum dot, a reduction potential of the at least one electrochemical inert ligand is greater than a potential of a bottom of a conduction band of the quantum dot body, an oxidation potential of the at least one electrochemical inert ligand is less than a potential of top of a valence band of the quantum dot body, and a replacement ratio of preliminary ligands with the at least one electrochemical inert ligand is at least 80%, and the at least one modifier includes the at least one electrochemical inert ligand, a compound including at least one cation of the at least one electrochemical inert ligand, a compound including at least one anion of the at least one electrochemical inert ligand, or their combinations.

In the above manufacturing method, first preparing a preliminary body of quantum dot, and then using a modifier to replace at least part of the preliminary ligands on the preliminary body, thereby forming the electrochemical inert ligand on the outer surface of the quantum dot body, i.e., forming quantum dot with the electrochemical inert ligand. Under electrical excitation condition, the electrochemical stability of the preliminary ligand is lower than that of the electrochemical inert ligand, and after injection of carriers, the preliminary ligand consumes carriers due to redox reaction, which reduces the number of recombination of carriers into quantum dot. On the contrary, because the electrochemical inert ligand is relatively stable in electrochemical, it will not react with the carriers, and thus will not consume the carriers, so that most of the carriers are used to emit light; on the other hand, the electrochemical inert ligand is relatively stable without detaching from the quantum dot body, and thus does not form a large number of defects that affect the luminous efficiency of quantum dot. Therefore, the quantum dot including electrochemical inert ligand has higher luminous efficiency, the corresponding device is more stable and of higher reliability.

In some specific embodiments of the present disclosure, the at least one modifier includes a first modifier, and the step S2 includes: step S21, preparing a first mixed solution, and heating so that the first modifier replaces at least part of each of the preliminary ligands to form a first electrochemical inert ligand on the outer surface of the quantum dot body, and purifying first mixed solution to obtain the quantum dot, and the first mixed solution includes the preliminary body, the first solvent and the first modifier. The first modifier and the preliminary body are dissolved in the first solvent, so that the replacement ratio of exchanging the first modifier with at least one of the cation of the preliminary ligand, the anion of the preliminary ligand, and the preliminary ligand itself is higher.

In the actual manufacturing process, step S21 can be repeated multiple times, so that the replacement ratio of exchanging the first modifier with the anion or cation of the preliminary ligand is higher, thereby making the quantum dot have more first electrochemical inert ligand, be higher luminous efficiency, the corresponding device be more stable and of higher reliability.

In order to replace and form a variety of electrochemical inert ligands on the outer surface of the quantum dot body, In some embodiments of the present disclosure, after the step S21, the manufacturing method further includes step S22, which includes: preparing a second mixed solution, replacing at least part of the preliminary ligands with the second modifier to form a second electrochemical inert ligand on the outer surface of the quantum dot body, and the second mixed solution includes the quantum dot, second solvent and the second modifier; heating the second mixed solution until a quantum yield of the quantum dot is greater than or equal to 80%.

In the actual manufacturing process, step S22 can be repeated multiple times, so that the replacement ratio of the anion or cation of the preliminary ligand with the second modifier is higher, thereby making the quantum dot with more second electrochemical inert ligand, resulting in higher luminous efficiency of the quantum dot, the corresponding device is more stable and of higher reliability.

In some embodiments, the first solvent and the second solvent are selected from solvents commonly used in quantum dot synthesis, such as octadecene, which is a non-coordinating solvent.

In the actual manufacturing process, those skilled in the art can decide whether to perform at least partial replacement of the preliminary ligand with the second modifier after step S21 according to the actual situation, to obtain quantum dot modified with a variety of electrochemical inert ligand In some embodiments, the at least one modifier of the present disclosure can be any chemical substance including anion of electrochemical inert ligand, or any chemical substance including cation of electrochemical inert ligand. Surely, the modifier may be the electrochemical inert ligand itself, and those skilled in the art can select a suitable modifier according to the actual situation. The modifier can be one or more, without limitation, the modifier can modify the preliminary body of quantum dot by cation exchange and anion exchange at the same time (for example, alkali metal sulfate, phosphate, halogen salt, etc. as a modifier), or multiple modifiers are added once or in multiple stages so that the preliminary ligand can be replaced with one or more types of electrochemical inert ligands.

In some other embodiments of the present disclosure, the at least one modifier includes at least one fatty amine, at least one alkylphosphine, at least one metal carboxylate, at least one inorganic metal salt, at least one inorganic acid, at least one thiolate, or a combination thereof. The fatty amine, alkylphosphine, metal carboxylate, inorganic metal salt, inorganic acid, thiolate, or combination thereof replaces the whole of the preliminary ligand. The electrochemical performance of the electrochemical inert ligand formed by these modifiers is more stable, which greatly improves the lifetime of quantum dot electroluminescent device.

In some specific embodiments of the present disclosure, at least one cation of the at least one inorganic metal salt includes at least one calcium ion, at least one magnesium ion, at least one aluminum ion, at least one zirconium ion, at least one lithium ion, at least one sodium ion, at least one barium ion, or a combination thereof. These cations have low possibility of being reduced.

In some specific embodiments of the present disclosure, at least one cation of the metal carboxylate includes at least one calcium ion, at least one magnesium ion, at least one aluminum ion, at least one zirconium ion, at least one lithium ion, at least one sodium ion, at least one barium ion, or a combination thereof. These cations have low possibility of being reduced.

In some specific embodiments of the present disclosure, at least one cation of the at least one inorganic metal salt and at least one cation of the at least one metal carboxylate include at least one calcium ion, at least one magnesium ion, at least one aluminum ion, at least one zirconium ion, at least one lithium ion, at least one sodium ion, at least one barium ion, or a combination thereof. These cations have low possibility of being reduced.

Surely, the cations of the inorganic metal salt and metal carboxylate of the present disclosure are not limited to the above-mentioned types, but can also be other cations capable of forming electrochemical inert ligand. Those skilled in the art can select the appropriate cation to fit the situation.

In the present disclosure, the anion of the inorganic metal salt, or the anion of the inorganic acid, or the anions of the inorganic metal salt and the inorganic acid, may be any anion of the prior art that being capable of forming the electrochemical inert ligand, those skilled in the art can select a suitable anion according to the actual situation.

In some specific embodiments of the present disclosure, at least one anion of the at least one inorganic metal salt includes at least one halogen ion, at least one phosphate ion, at least one sulfate ion, or a combination thereof.

In some specific embodiments of the present disclosure, at least one anion of the at least one inorganic acid includes at least one halogen ion, at least one phosphate ion, at least one sulfate ion, or a combination thereof.

In some specific embodiments of the present disclosure, at least one anion of the at least one inorganic metal salt and at least one anion of the inorganic acid include at least one halogen ion, at least one phosphate ion, at least one sulfate ion, or a combination thereof.

In some other embodiments of the present disclosure, the first mixed solution further includes a precursor of an anion which is same with an anion of the quantum dot body, and the anion can react with the cation on the surface of the quantum dot body, thus the quantum dot body can be more stable, and the stability of the modifier and preliminary ligand exchange system can be guaranteed, and the replacement ratio of the modifier and modifier ligand is further improved, thereby obtaining quantum dot with more electrochemical inert ligands. If the quantum dot is a core-shell structure, the anion of the quantum dot body only refers to the anion of the shell.

Those skilled in the art can select a suitable electrochemical inert ligand according to the actual situation, in an embodiment of the present disclosure, the electrochemical inert ligand includes fatty amine. In some other embodiments of the present disclosure, the at least one electrochemical inert ligand includes fatty amine and alkylphosphine.

For the availability of raw materials, in some embodiments of the present disclosure, the fatty amine is a C4-C22 fatty amine. In order to further form a more stable coordination bond with the surface of the quantum dot. In some other embodiments of the present disclosure, the fatty amine is a C8-C18 primary amine. The alkylphosphine is preferably a trialkylphosphine, such as trioctylphosphine.

In some embodiments, the alkylphosphine is a trialkylphosphine, wherein the alkyl group in the three alkyl groups are independently selected from alkyl group having 2 to 10 carbon atoms.

In some embodiments, the preliminary body in the present disclosure can be made by any manufacturing method for quantum dot in the prior art, and those skilled in the art can select appropriate method to form the corresponding preliminary body according to the composition of the corresponding preliminary body.

In other embodiments of the present disclosure, a single-photon source is provided, including a quantum dot, the quantum dot being any of the above quantum dot or made by any one of the above manufacturing methods.

The above single photon source includes the quantum dot, so that its performance is stable and its reliability is high.

In some other embodiments of the present disclosure, there is provided a QLED device, including a quantum dot, the quantum dot being any one of the above quantum dot or made by any one of the above manufacturing method.

The QLED device includes the quantum dot, so that its performance can be stable and its lifetime can be long.

In order to enable those skilled in the art to more clearly understand the technical solutions and technical effects of the present disclosure, the following will be described in conjunction with specific embodiments.

Example 1

The manufacturing process of quantum dot was as follows:

Preliminary body of the quantum dot was first prepared. The preliminary body was a core-shell structured quantum dot, specifically, a red CdSe/CdS core-shell quantum dot. The synthesis process included:

0.2 mmol of cadmium oxide, 0.6 mmol of stearic acid were weighed and mixed with 3 mL of ODE, and heated to 260° C. to dissolve.

1 mL*0.1 mol of selenium powder-ODE suspension was injected into the solution formed in the previous step, and after 8 minutes, 0.05 mL*0.1 mol of selenium powder-ODE suspension was injected every 3 minutes until CdSe quantum dots grew to the required size (the first exciton absorption peak was at 550 nm), an original reaction solution was obtained.

CdSe quantum dot core purification: 2 mL of acetone, 0.5 mL of methanol were added into 1 mL of the original reaction solution, heated and centrifuged, the supernatant was discard. The precipitate was dissolved with 1 mL of toluene, subsequently, 1 mL of methanol was added, the mixture was heated and centrifuged. This step was repeated for 2 times.

CdSe/CdS core-shell quantum dot synthesis: 1 mmol of cadmium acetate, 0.85 mL of oleic acid, 0.15 mL of decanoic acid, and 4 mL of ODE were weighed and mixed, heated to 150° C. and purged with gas for 10 minutes to form a reaction solution. The CdSe quantum dot cores were dissolved with cyclohexane, then injected into the reaction solution, purged with gas for 10 minutes, the reaction temperature was increased to 260° C., 0.1 mol of S-ODE solution at a drop rate of 4 mL/h was added until the required thickness of CdS was achieved (its emission peak was at 631 nm).

CdSe/CdS core-shell quantum dot purification: as same as the CdSe quantum dot core purification.

Then, at least part of the preliminary ligand was replaced with modifier to form electrochemical inert ligand on the outer surface of the quantum dot body, and the modifier was oleylamine. The specific process included:

CdSe/CdS core-shell quantum dots (ligand was cadmium carboxylate) dissolved in a solution including 2 mL of ODE, 2 mL of oleylamine and 1 mL*0.1 mol of S-ODE was heated to 120° C., reacted for 20 minutes. After cooling, 2 mL of methanol was added for centrifugal precipitation.

The above step was repeated until the quantum yield of core-shell quantum dot reached 80%.

Example 2

Differed from Example 1 in that the modifier was n-octylamine.

Example 3

Differed from Example 2 in that the preliminary body of quantum dot was red CdSe/CdZnS quantum dot, and the synthesis process included:

0.2 mmol of cadmium oxide, 0.6 mmol of stearic acid were weighed and mixed with 3 mL of ODE, and heated to 260° C. to dissolve.

1 mL*0.1 mol of selenium powder-ODE suspension was injected into the solution formed in the previous step. After 8 minutes, 0.05 mL*0.1 mol of selenium powder-ODE suspension was injected every 3 minutes until CdSe quantum dots grew to the required size (the first exciton absorption peak was at 550 nm), an original reaction solution was obtained.

CdSe quantum dot core purification: 2 mL of acetone, 0.5 mL of methanol were added into 1 mL of the original reaction solution, heated and centrifuged, and the supernatant was discarded. The precipitate was dissolved with 1 mL of toluene, subsequently 1 mL of methanol was added, the mixture was heated and centrifuged. This step was repeated for 2 times.

3 mmol of zinc acetate, 0.3 mmol of cadmium acetate, 8 mmol of oleic acid and 20 mL of ODE were added in a 100 mL three-necked flask and heated to 300° C. to dissolve. 2 mL of CdSe cores were injected into the three-necked flask, and then 2.5 mL of 1 mM STBP solution was injected quickly into the three-necked flask, the reaction was stopped and cooled down after 15 min reaction.

Example 4

Differed from Example 3 in that the modifier was oleylamine.

Example 5

Differed from Example 1 in the process of replacing the preliminary ligand with the modifier, the modifier included oleylamine and TBP, specifically included:

At least part of the above preliminary ligands was replaced with the modifier to form electrochemical inert ligands on the outer surface of the quantum dot body, and the modifier was oleylamine and TBP. The specific process included:

CdSe/CdS core-shell quantum dots (ligand was cadmium carboxylate) dissolved in a solution including 2 mL of ODE, 2 mL of oleylamine and 1 mL*0.1 mol of S-ODE were heated to 120° C. and reacted for 20 minutes. After cooling down, 2 mL of methanol was added for centrifugal precipitation.

The previous step was repeated two more times, the quantum dots dissolved in a mixed solution of 2 mL of toluene and 2 mL of oleylamine were added with 0.1 mL of alkylphosphine (TBP), the quantum dots were annealed at 50° C. until the quantum yield of the core-shell quantum dots approached 90%.

Example 6

Differed from Example 1 in the process of replacing the preliminary ligand with modifier. The modifier was magnesium acetate, and the specific process included:

1 mmol of magnesium acetate, 3 mmol of oleic acid and 4 mL of ODE were mixed to form a solution, and purged with gas at 150° C. for 20 minutes, and the preliminary body of the quantum dot was dispersed in ODE and added to the solution. The temperature was raised to 200° C. and the temperature was kept for 30 minutes. Cooled down and the quantum dots were purified.

Example 7

Differed from Example 1 in the process of replacing the preliminary ligand with modifier. The modifier was magnesium acetate, and the specific process included:

1 mmol of magnesium acetate, 3 mmol of oleic acid and 4 mL of ODE were mixed to form a solution, and purged with gas at 150° C. for 20 minutes, and then cooled to 100° C. The quantum dots obtained in Example 5 were dispersed in 2 mL of toluene and added to the solution, and the temperature was kept for 1 hour. Cooled down and the quantum dots were purified.

Example 8

Differed from Example 1 in that the preliminary body of quantum dot was blue CdSeS/ZnSeS quantum dot, and the synthesis process included:

1 mmol of cadmium acetate, 2.5 mmol of oleic acid and 15 mL ODE were weighed in a 50 mL three-necked flask, heated to 300° C. to dissolve. 2 mL of 0.5 mM selenium sulfur ODE solution (molar ratio of sulfur to selenium=3:1) was injected into the three-necked flask, the reaction was stopped and cooled down after 10 minutes reaction.

CdSeS quantum dot core purification: 2 mL of acetone and 0.5 mL of methanol were added into 1 mL of the original reaction solution, heated and centrifuged, and the supernatant was discarded. The precipitate was dissolved with 1 mL of toluene, subsequently, 1 mL of methanol was added, the mixture was heated and centrifuged. This step was repeated 2 for times.

10 mmol of zinc acetate, 28 mmol of oleic acid and 40 mL of ODE were taken in a 250 mL three-necked flask, and heated to 300° C. to dissolve. 5 mL of CdSeS cores were injected into the three-necked flask, and then 5 mL of 1 mM TBP solution of Se and S (molar ratio of Se:S=1:3) was injected into the three-necked flask, the reaction was stopped and cooled down after 30 min reaction. The quantum dots were purified as the method mentioned above.

Example 9

Differed from Example 1 in the process of replacing the preliminary ligand with a modifier including phosphoric acid and alkylphosphine. The specific process included: 0.5 mmol phosphoric acid, 2 mL toluene and 0.05 mL TBP (tributyl phosphine) were mixed to form a mixed solution, CdSe/CdS quantum dots were dispersed in toluene, and then the quantum dots toluene solution was added to the mixed solution and incubated at 60° C. for 2 hours. Cooled down and the quantum dots were purified.

Comparative Example 1

Differed from Example 1 in that it did not include the replacement process between preliminary ligand and modifier.

Comparative Example 2

Differed from Example 3 in that it did not include the replacement process between preliminary ligand and modifier.

Comparative Example 3

Differed from Example 8 in that it did not include the replacement process between preliminary ligand and modifier.

The quantum dots of the above examples and comparative examples were applied to QLED devices. The manufacturing process of the QLED device included:
1. Substrate cleaning: the ITO substrate and glass was cleaned with ethanol and acetone, if necessary, with detergent, and then ultrasonically cleaned with acetone, deionized water, and anhydrous ethanol for 10 minutes sequentially, and then a nitrogen gun was used for fast drying the substrate, and finally, was treated under air plasma for 10 minutes.
2. PEDOT:PSS layer:PEDOT:PSS was spin-coated on the ITO substrate at 3000 rpm, and the spin-coating time was 60 s. After the spin coating was completed, annealed in air at 150° C. for 15 minutes, and then transferred to a glove box filled with nitrogen after being treated with oxygen plasma for 5 minutes.
3. Hole transport layer: 8 mg/mL of poly-TPD chlorobenzene solution was spin-coated on the glass/ITO/PEDOT:PSS at a speed of 2000 rpm, spin coating time was 45 s, and then annealed in the glove box at 120-150° C. for 30 min.
4. Laminated hole transport layer: 1.5 mg/mL of PVK solution dissolved in m-xylene was thermally coated on the poly-TPD layer at a speed of 2000 rpm at 40-50° C., spin coating time was 45 s, then annealed in a glove box at 150° C. for 20 min.
5. Quantum dot layer: the quantum dot dissolved in n-octane solution was spin-coated on the hole transport layer at 2000 rpm, and the spin coating time was 60 s. The concentration of red quantum dots was 10-15 mg/mL, the optical density (OD) was 80-120 at 400 nm, and optical density of the green and blue quantum dots were about 50-60 at 350 nm. No annealing treatment.
6. Electron transport layer: an ethanol solution of $Zn_{0.9}Mg_{0.1}O$ was spin-coated on the quantum dot layer at 2000 rpm, and the spin-coating time was 45 s. The concentration of $Zn_{0.9}Mg_{0.1}O$ was 30 mg/mL, and the optical density was 200-300 at 280 nm. After the spin coating was completed, annealed in a glove box at 70° C. for 20 min.
7. Put the spin-coated sample into the vacuum chamber, and vapor-deposited the top silver electrode. The evaporation rate was controlled at 0.5 Å/s for the first 10 nm thickness and later around 2.0 Å/s. The electrode thickness was 100 nm.
8. After the vapor deposition was completed, it was encapsulated with curing agent for water and oxygen barrier.

A tailored system with 32 channels made by Guangzhou New Vision Company was adopted for lifetime testing. The architecture of the system was driven by constant voltage and constant current source to test the change of voltage or current of QLED; a photodiode detector and test system was used to record the change of QLED's brightness (photocurrent); a brightness meter was used to test and calibrate the brightness (photocurrent) of QLED.

Figure 2:
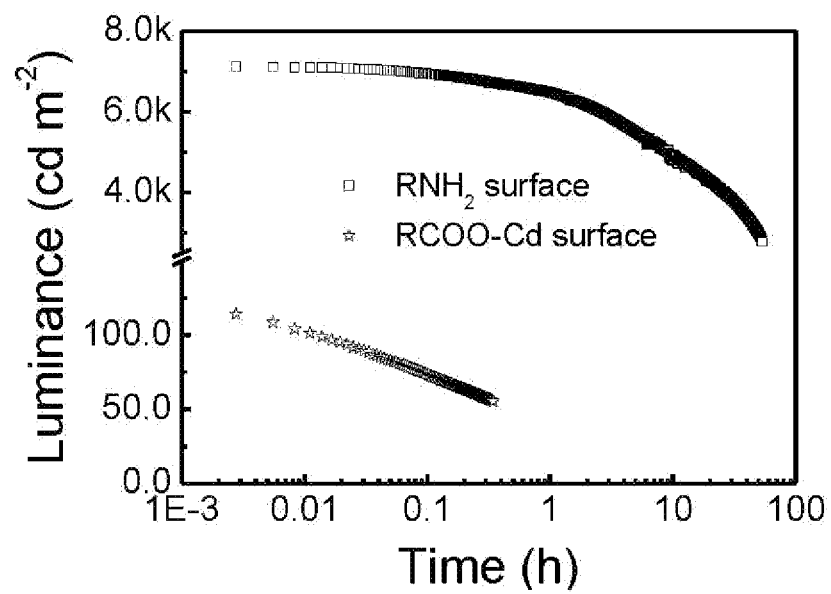
Figure 3:
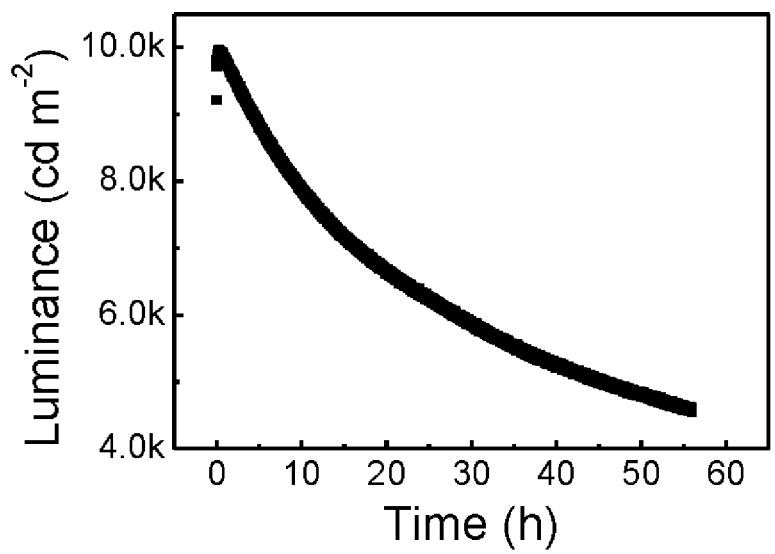
Figure 4:
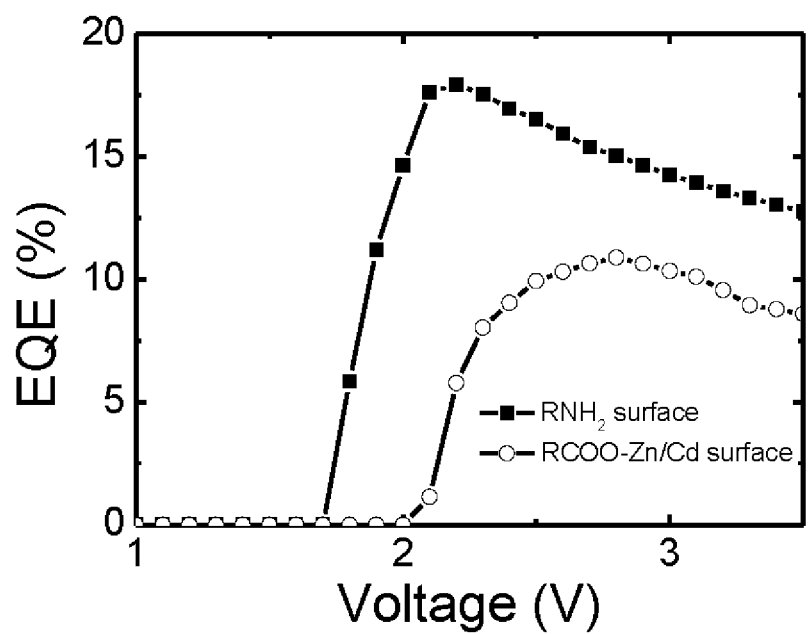
Figure 5:
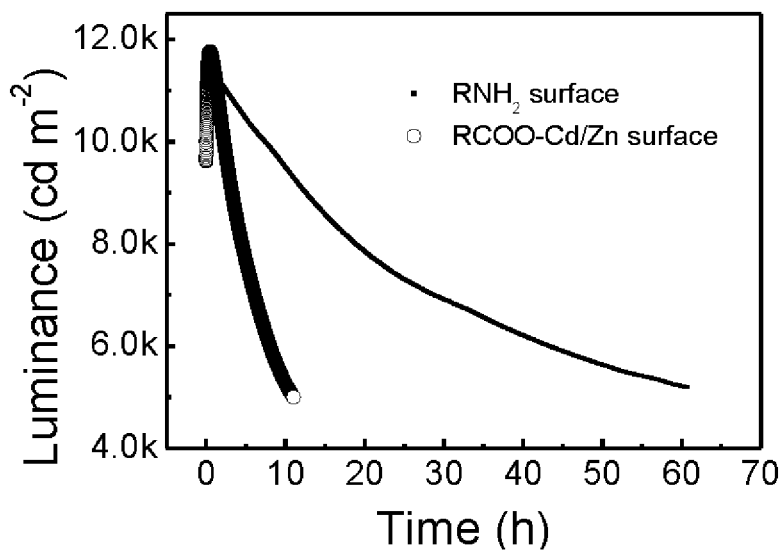
Figure 6:
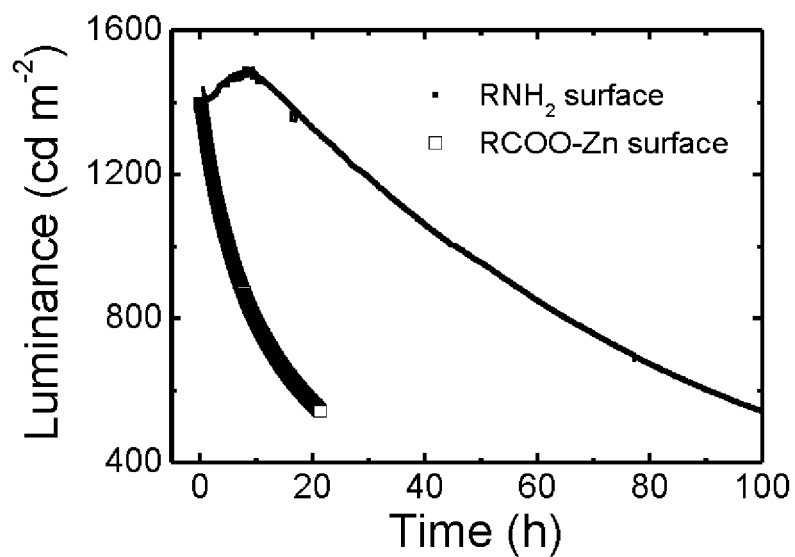
Figure 7:
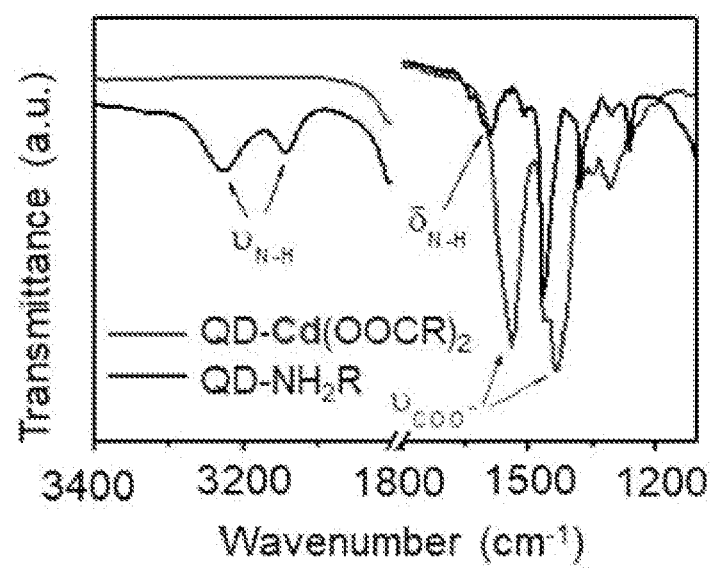

The test results were shown in Table 1, the test result of the QLED device corresponding to Example 5 was shown in FIGS. 1 and 2, the test result of the QLED device corresponding to Example 2 was shown in FIG. 3, and the test result of QLED device corresponding to Example 3 was shown in FIGS. 4 and 5, and the test result of the QLED device corresponding to Example 8 was shown in FIG. 6. The test result of the QLED device corresponding to Comparative Example 1 was shown in FIG. 1, FIG. 2 and FIG. 6. The test result of the QLED device corresponding to Comparative Example 2 was shown in FIGS. 4 and 5. The half-life lifetime data in Table 1 was the half-life lifetime of the device measured under an initial brightness of 100 cd $m^{-2}$. FIG. 7 was an infrared detection result of quantum dots of Example 1. It can be seen that there was almost no carboxylate signal after the ligand exchange, which proved that the amine ligand of quantum dot of Example 1 was almost 100%.

TABLE 1

|  | Half-life (hours) | EQE max (%) |
| --- | --- | --- |
| Example 1 | 100000 | 18.6 |
| Example 2 | 250000 | 18 |
| Example 3 | 200000 | 18 |
| Example 4 | 180000 | 15 |
| Example 5 | 100000 | 19 |
| Example 6 | 70000 | 10 |
| Example 7 | 85000 | 10 |
| Example 8 | 10000 | 9 |
| Example 9 | 120000 | 10 |
| Comparative Example 1 | 0.5 | 0.2 |
| Comparative Example 2 | 40000 | 10 |
| Comparative Example 3 | 2000 | 12 |

The beneficial effects of quantum dot surface treatment on efficiency and lifetime of device are described below.

Comparative Example 1 and Example 5 are both CdSe/CdS system, the surface of Comparative Example 1 is cadmium carboxylate, and quantum dot in Example 5 has surface of oleylamine ligand after ligand exchange. The EQE of quantum dot device with quantum dot having cadmium carboxylate on the surface is as low as 0.2%, while the EQE of the device with quantum dot having oleylamine ligand on the surface is as high as 19%. There are two orders of magnitude difference between the two. See FIG. 1 for details. Under the initial brightness condition, the half-life lifetime $T_{50}$ of the device of Comparative Example 1 is only 10 minutes, while the half-life time $T_{50}$ of the device of Example 5 at the initial brightness condition of 7000 cd $m^{-2}$ exceeds 50 hours. It can be seen that the surface of oleylamine ligand greatly improves the stability of the device, see FIG. 2 for details.

After treating the CdSe/CdS system of Example 2 with n-octylamine, the half-life lifetime $T_{50}$ of the corresponding device under the initial brightness condition of 11500 cd m$^{-2}$ also exceeds 50 hours, see FIG. 3.

In the CdSe/CdZnS alloy system of Example 3, after treating the quantum dots on the surface of the carboxylate with n-octylamine, the EQE of the device also increases from 10% to more than 18%, and the half-life lifetime $T_{50}$ device measured at 10000cd m$^{-2}$ under initial brightness condition increases from 10 hours to 50 hours. See FIG. 4 and FIG. 5 for details.

In the blue-light emitting CdSeS/ZnSeS alloy system of Example 8, the quantum dots with carboxylate on the surface are treated with oleylamine, and the half-life $T_{53}$ of the device measured at an initial brightness of 1500 cd m$^{-2}$ increases from 15 hours to 80 hours, see FIG. 6.

From the above description, it can be seen that the above embodiments of the present disclosure achieve the following technical effects:

1). The quantum dot body of the present disclosure has an electrochemical inert ligand on the outer surface of the quantum dot body. Under electrical excitation condition, on the one hand, the ligand is electrochemically stable and will not react with carriers, i.e. no carriers are consumed, so that most of the carriers are used to emit light; on the other hand, because the electrochemical inert ligand is relatively stable, it will not fall off, and will not form a large number of defects that affect the luminous efficiency of quantum dots. Therefore, since the quantum dot including an electrochemical inert ligand has higher luminous efficiency, the corresponding device will be more stable and of higher reliability.

2). The single-photon source of the present disclosure includes the above-mentioned quantum dot, so that its performance is stable and its reliability is high.

3). The QLED device of the present disclosure includes the above-mentioned quantum dot, so that its performance is stable and its reliability is high.

The above examples are merely demonstrative of the present disclosure, and are not intended to limit the present disclosure. For those skilled in the art, the present disclosure may have various modifications and changes. Any modification, equivalent replacement, improvement, etc. made within the spirit and principle of this disclosure shall be included in the protection scope of this disclosure.

What is claimed is:

1. A method for manufacturing a quantum dot, wherein the method comprises:
   step S1, preparing a preliminary body of a quantum dot, the preliminary body comprising a quantum dot body and preliminary ligands disposed on an outer surface of the quantum dot body;
   step S2, replacing at least part of the preliminary ligands with at least one modifier to form at least one electrochemical inert ligand on the outer surface of the quantum dot body, thereby forming the quantum dot, a reduction potential of the at least one electrochemical inert ligand is greater than a potential of a bottom of a conduction band of the quantum dot body, an oxidation potential of the at least one electrochemical inert ligand is less than a potential of top of a valence band of the quantum dot body, and a replacement ratio of preliminary ligands with the at least one electrochemical inert ligand is at least 80%, and the at least one modifier comprises the at least one electrochemical inert ligand, a compound comprising at least one cation of the at least one electrochemical inert ligand and at least one anion of the at least one electrochemical inert ligand, a compound comprising at least one cation of the at least one electrochemical inert ligand, a compound comprising at least one anion of the at least one electrochemical inert ligand, or their combinations,
   wherein the at least one modifier comprises a first modifier, and the step S2 comprises:
   step S21, preparing a first mixed solution, and heating the first mixed solution so that the first modifier replaces at least part of each one of the preliminary ligands to form a first electrochemical inert ligand on the outer surface of the quantum dot body, purifying the first mixed solution after replacement to obtain the quantum dot, and the first mixed solution comprising the preliminary body, a first solvent, and the first modifier,
   wherein after the step S21, the manufacturing method further comprises a step S22, and the step S22 comprises:
   preparing a second mixed solution, replacing at least part of the preliminary ligands with the second modifier to form a second electrochemical inert ligand on the outer surface of the quantum dot body, the second mixed solution comprising the quantum dot, a second solvent, and the second modifier;
   heating the second mixed solution until a quantum yield of the quantum dot is greater than or equal to 80%.

2. The manufacturing method according to claim 1, wherein the at least one modifier comprises at least one fatty amine, at least one alkylphosphine, at least one metal carboxylate, at least one inorganic metal salt, at least one inorganic acid, at least one thiolate, or a combination thereof.

3. The manufacturing method according to claim 2, wherein at least one cation of the at least one inorganic metal salt comprises at least one calcium ion, at least one magnesium ion, at least one aluminum ion, at least one zirconium ion, at least one lithium ion, at least one sodium ion, at least one barium ion, or a combination thereof.

4. The manufacturing method according to claim 2, wherein at least one cation of the metal carboxylate comprises at least one calcium ion, at least one magnesium ion, at least one aluminum ion, at least one zirconium ion, at least one lithium ion, at least one sodium ion, at least one barium ion, or a combination thereof.

5. The manufacturing method according to claim 2, wherein at least one cation of the at least one inorganic metal salt and at least one cation of the at least one metal carboxylate comprise at least one calcium ion, at least one magnesium ion, at least one aluminum ion, at least one zirconium ion, at least one lithium ion, at least one sodium ion, at least one barium ion, or a combination thereof.

6. The manufacturing method according to claim 2, wherein at least one anion of the at least one inorganic metal salt comprises at least one halogen ion, at least one phosphate ion, at least one sulfate ion, or a combination thereof.

7. The manufacturing method according to claim 2, wherein at least one anion of the at least one inorganic acid comprises at least one halogen ion, at least one phosphate ion, at least one sulfate ion, or a combination thereof.

8. The manufacturing method according to claim 2, wherein at least one anion of the at least one inorganic metal salt and at least one anion of the inorganic acid comprise at least one halogen ion, at least one phosphate ion, at least one sulfate ion, or a combination thereof.

9. The manufacturing method according to claim 1, wherein the first mixed solution further comprises a precursor of an anion which is same with an anion of the quantum dot body.

10. The manufacturing method according to claim 5, wherein the electrochemical inert ligand comprises a fatty amine.

11. The manufacturing method according to claim 5, wherein the electrochemical inert ligand comprises an alkylphosphine.

12. The manufacturing method according to claim 5, wherein the at feast one electrochemical inert ligand comprises a fatty amine and an alkylphosphine.

13. The manufacturing method according to claim 10, wherein the fatty amine is a C4-C22 fatty amine.

* * * * *